United States Patent
Wong

Patent Number: 5,414,312
Date of Patent: May 9, 1995

[54] ADVANCED SIGNAL DRIVING BUFFER WITH DIRECTIONAL INPUT TRANSITION DETECTION

[75] Inventor: Myron W. Wong, San Jose, Calif.

[73] Assignee: Altera Corporation, San Jose, Calif.

[21] Appl. No.: 92,350

[22] Filed: Jul. 15, 1993

[51] Int. Cl.⁶ .......................................... H03K 17/16
[52] U.S. Cl. ..................................... 326/83; 326/21; 327/170
[58] Field of Search ..................... 307/443, 451, 263

[56] References Cited

U.S. PATENT DOCUMENTS

| | | | |
|---|---|---|---|
| 4,567,378 | 1/1986 | Rayer | 307/443 |
| 4,612,466 | 9/1986 | Stewart | 307/451 |
| 4,621,208 | 11/1986 | Van Tran | 307/443 |
| 4,829,199 | 5/1989 | Prater | 307/443 |
| 4,849,658 | 7/1989 | Iwamura | 307/443 |
| 4,876,465 | 10/1989 | Podkowa | 307/443 |
| 4,880,997 | 11/1989 | Steele | 307/451 |
| 5,124,584 | 6/1992 | McClure | 307/480 |
| 5,170,072 | 12/1992 | Ihara | 307/264 |

Primary Examiner—Edward P. Westin
Assistant Examiner—Andrew Sanders
Attorney, Agent, or Firm—Townsend and Townsend Khourie and Crew

[57] ABSTRACT

A set of signal buffering circuits for driving heavily loaded signal lines. The buffer circuits detect a signal transition before the signal reaches logical threshold levels, and help drive the signal in the detected transition direction. The early transition detection and drive help reduce signal propagation delay across heavily loaded lines.

14 Claims, 4 Drawing Sheets

ADVANCED SIGNAL DRIVING BUFFER WITH DIRECTIONAL INPUT TRANSITION DETECTION

BACKGROUND OF THE INVENTION

The present invention relates generally to signal driving buffer circuits, and more particularly to a set of buffer circuits that increase the speed of signal propagation across heavily loaded lines by early detection of signal transitions.

Buffer circuits are typically utilized either at a signal source, or at the receiving end (i.e. input to a circuit). When a buffer circuit is used at an input to a circuit, the main purpose of buffering is to reshape the falling and rising edges of the signal. An input signal having sharper edges increases the response time of the receiving circuit. However, the signal propagation time through the line is not affected. When a buffer circuit is used at a signal source, it acts as an output driver enabling the source to drive the resistive/capacitive (R/C) loading due to line parasitics and load devices. To be able to drive larger loads, stronger buffer circuits are required which translates to larger transistor sizes. Thus, when an output signal leaves an integrated circuit chip to drive external circuitry, large output buffer circuits are required to drive the increased loading.

The overall chip size requirements often place a limit on how large output buffer transistors can be. The buffer circuit size becomes especially critical when there are a large number of very long connector lines inside a chip that require buffer circuits. An example of such a chip can be found in high density programmable logic devices. These devices typically contain a large number of connector buses (or global lines) that must travel long distances across the chip. In these types of chips, size considerations force the designer to compromise signal propagation speed.

From the foregoing it can be appreciated that there is a need for an improved signal buffer circuit that can increase the speed of signal propagation through heavily loaded lines without requiring unacceptably large silicon area.

SUMMARY OF THE INVENTION

The present invention provides a set of buffer circuits that speed up signal propagation through heavily loaded lines by early detection of signal transition.

In one embodiment, the present invention provides a buffer circuit that is used at a point along the signal path between the signal source and the destination. The buffer circuit detects the start of, as well as the direction of, a signal transition and activates a driver circuit to help drive the large R/C line to reduce overall propagation time. In the low to high direction, the buffer circuit activates only after one n-channel transistor threshold voltage ($V_{tn}$) rise in the signal level, and applies an assisting drive to the line in the same direction. The circuit then tristates itself using a feedback delay path upon the completion of the transition. In the high to low direction, the buffer circuit operates in a similar fashion but in the opposite direction, activated after one p-channel transistor threshold voltage ($V_{tp}$) fall in the signal level. The early detection and boost reduces signal propagation by at least the amount of time the signal would require to reach a logical "1" or "0" threshold level.

In another embodiment, the present invention provides a buffer circuit that is designed to operate as an end-of-line buffer circuit. Similar early transition detection principle as in the first embodiment is applied such that the detection circuit responds to a signal transition upon a single threshold voltage change in the signal level. The circuit produces full level switching before the received input completes the transition. Therefore, the overall signal propagation delay is reduced by requiring only a partial transition at the end of the line to generate full signal switching.

A further understanding of the nature and advantage of the buffer circuits of the present invention may be gained with reference to the description and diagrams below.

DESCRIPTION OF THE SPECIFIC EMBODIMENTS

Figure 1:
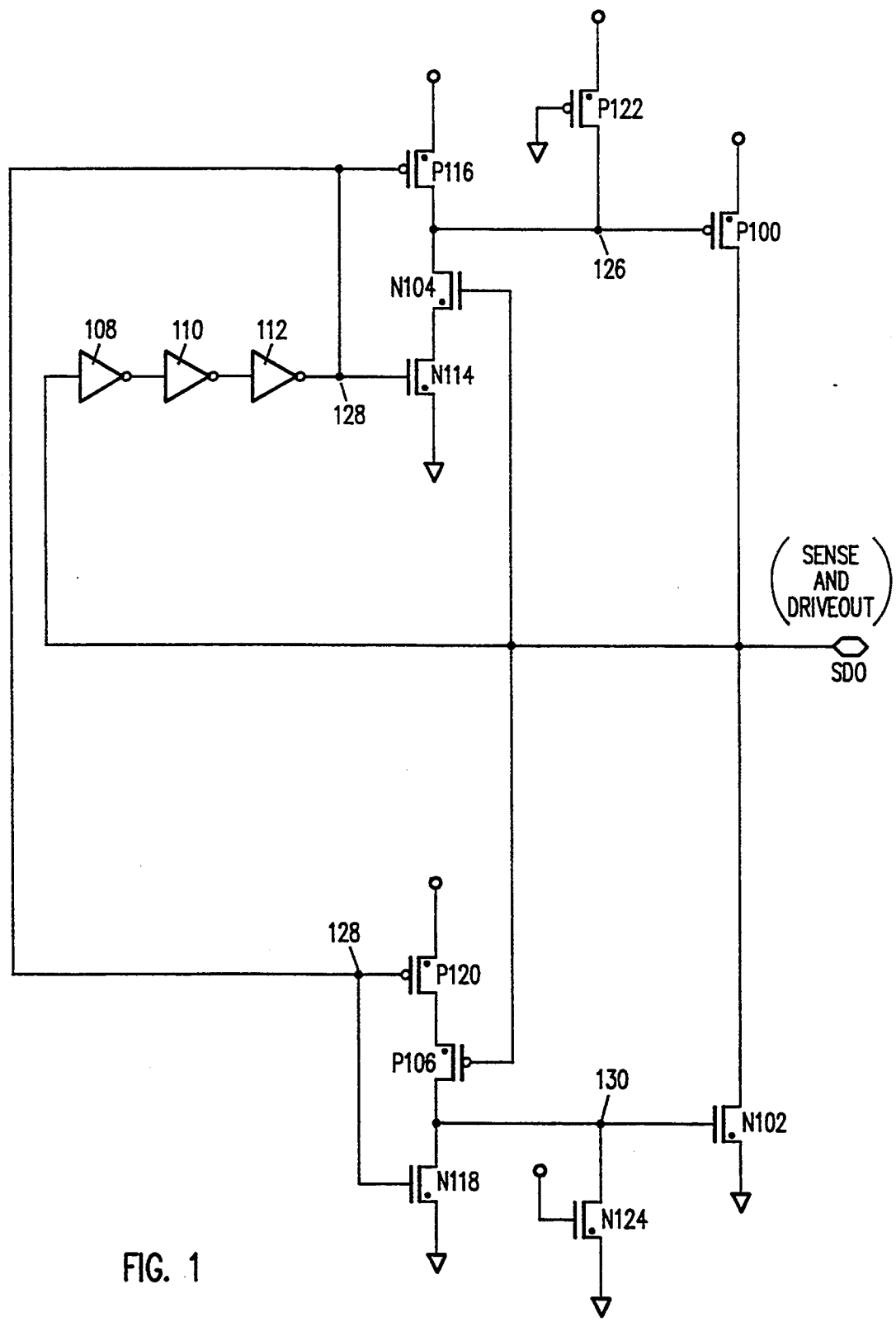
FIG. 1 is a circuit schematic of one embodiment of the buffer circuit of the present invention.

Referring to FIG. 1, there is shown a circuit schematic of a buffer according to one embodiment of the present invention. The buffer circuit includes a driver stage having a pair of line driver transistors P100 and N102 with their drain terminals connected together. The common drain of the two transistors connect to the output of the circuit, SDO, which connects to the signal line. The signal line also connects to the gate terminals of two sense transistors N104 and P106. The sense transistors connect to a tristate circuit that help tristate the driver transistors P100 and N102 after signal transition is completed. The tristate circuit includes three inverters 108, 110 and 112 that are serially connected together to form a delay chain. The delay chain provides a feedback path, feeding the signal on the line at SDO back to the rest of the tristate circuit. The tristate circuit includes transistors N114 and P116 on the positive side, and transistors N118 and P120 on the negative side. When in the tristate mode, a pull-up transistor P122 pulls the gate terminal of P100 up to the positive power supply (VDD), and a pull-down transistor N124 pulls the gate terminal of N102 down to the negative power supply (or ground), respectively.

This circuit may be used once or multiple times along a signal routing line to decrease signal propagation delay through large R/C paths by connecting it's SDO output node directly to the line. The circuit operates as follows. For a low to high transition, the signal at SDO starts at ground level, and therefore, the output of the delay chain (node 128) is at VDD. This ensures that transistors N114 and N118 are turned on. Pull-up transistor P122 is also turned on, connecting node 126 to VDD, which keeps driver transistor P100 turned off. When the voltage on the line (SDO) reaches one $V_{tn}$ above ground, sense transistor N104 turns on, temporarily connecting node 126 to ground through transistor N114. The sizes of transistors N104, N114 and P122 are adjusted such that, when turned on, the two n-channel transistors N104 and N114 overcome the p-channel pull-up transistor P122. A ground voltage at the gate of the p-channel driver transistor P100 causes it to turn on, which helps pull the signal at SDO up to VDD. This action helps speed up the rising transition of the signal.

A short delay after the completion of the signal transition from ground to VDD, the low voltage at the output of the three inverters 108, 110, and 112 (node 128) causes transistor N114 to turn off and transistor P116 to turn on. This will disconnect the gate of P100 (or node 126) from ground and connect it to VDD through transistors P116 and P122. Therefore, the high-going boost provided by driver transistor P100 is active for a short period of time; long enough to complete the transition. During this period, the voltage on node 130 in the lower half of the circuit remains at ground, keeping the n-channel driver transistor N102 turned off. When output drivers are tristated, the signal voltage on the line takes over.

For a high to low transition, the signal at SDO starts at VDD, and therefore, the output of the delay chain (node 128) is at ground. This ensures that transistors P116 and P120 are turned on. Pull-down transistor N124 is also turned on, connecting node 130 to ground, which keeps driver transistor N102 turned off. When the voltage on the line (SDO) falls one $V_{tp}$ below VDD, sense transistor P106 turns on, temporarily connecting node 130 to VDD through transistor P120. The sizes of transistors P106, P120 and N124 are adjusted such that, when turned on, the two p-channel transistors P106 and P120 overcome the n-channel pull-down transistor N124. A high voltage (VDD) at the gate of the n-channel driver transistor N102 causes it to turn on, which helps pull the signal at SDO down to ground. This action helps speed up the falling transition of the signal.

A short delay after the completion of the signal transition from VDD to ground, the high voltage at the output of the three inverters 108, 110, and 112 (node 128) causes transistor P120 to turn off and transistor N118 to turn on. This will disconnect the gate of N102 (or node 130) from VDD and connect it to ground through transistors N118 and N124. Therefore, the low-going boost provided by driver transistor N102 is active for a short period of time; long enough to complete the transition. During this period, the voltage on node 126 in the upper half of the circuit remains at VDD, keeping the p-channel driver transistor P100 turned off.

Therefore, with the buffer circuit connected to the routing line, the signal transition is boosted in the right direction before logic thresholds have been reached. Because an appreciable gain in speed of propagation is realized by the early detection of transition, the buffer circuit need not rely on very large driver transistors (P100 and N102).

Figure 2:
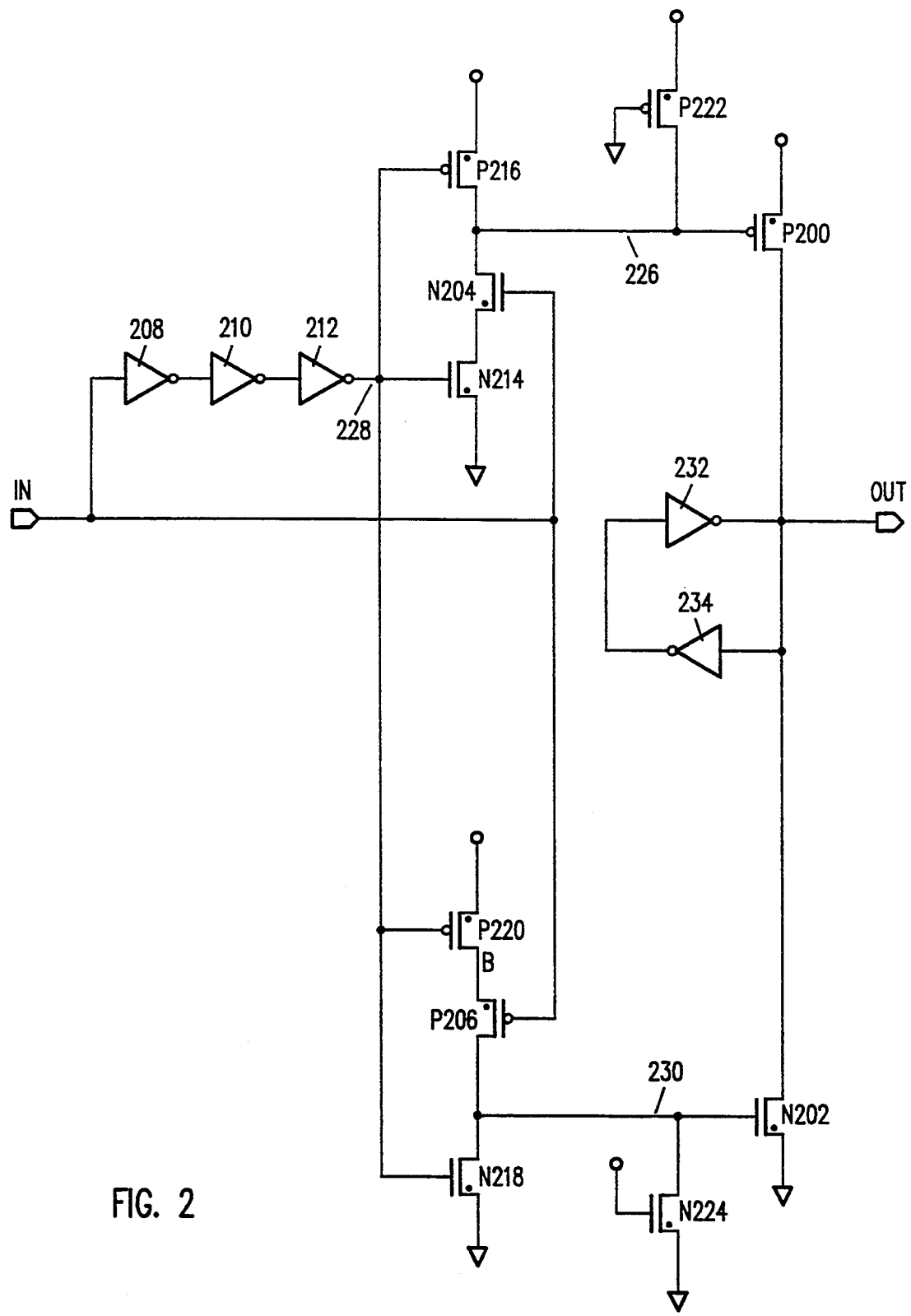
FIG. 2 is a circuit schematic of a second embodiment showing an end-of-line buffer circuit for lines that switch full rail to rail.

FIG. 2 is a circuit schematic of a second embodiment showing an end-of-line buffer circuit. This circuit operates based on the same early detection principle as the circuit of FIG. 1, and it is architecturally very similar to that circuit. The main differences are the separation of the input of the inverter chain from the output, and the inclusion of a latch at the output. Accordingly, this buffer circuit includes two driver transistors P200 and N202, sense transistors N204 and P206, tristate circuit made up of transistors P216 and N214 on the positive half and P220 and N218 on the negative half, pull-up transistor P222, pull-down transistor N224, and three serially connected inverters 208, 210 and 212. A cross-coupled pair of inverters 226 and 228 provide a latch at the output. The signal on the line connects to the input of the inverter chain and the gate terminal of the sense transistors N214 and P206. The output of the circuit at the common drain node of the driver transistors P200 and N202 connects to the input of the receiving circuit.

For a low to high transition, when the line voltage reaches one $V_{tn}$ above ground, the gate of driver transistor P200 (node 226) is pulled to ground through transistors N204 and N214. This will cause driver transistor P200 to turn on, pulling the output up to VDD to complete the transition. With a short delay thereafter, P200 is tristated. However, in this circuit inverters 232 and 234 latch the output signal upon completion of transition.

For a high to low transition, when the line voltage drops one $V_{tp}$ below VDD, the gate of driver transistor N202 (node 230) is pulled to VDD through transistors P206 and P220. This will cause driver transistor N202 to turn on, pulling the output down to ground to complete the transition. With a short delay thereafter, N202 is tristated. Once again, the output is latched upon completion of the transition.

The buffer circuits of FIGS. 1 and 2 may be modified to be used on signal lines that do not swing to full rail (i.e. full VDD). These types of signal lines are common in circuits where the signal passes through a single-transistor transmission gate with a control voltage at its gate terminal not greater than VDD. Therefore, the signal passing through the gate must be at least one threshold voltage below the VDD level (i.e. VDD-$V_{tn}$). This affects the circuit operation in two ways. First, to maintain the VDD-$V_{tn}$ level of the signal, the buffer circuit must not pull the output up to full VDD. Therefore, the p-channel driver transistor should be replaced by an n-channel transistor to limit the swing of the signal to VDD-$V_{tn}$. The size of the transistor must then be adjusted to reflect the stronger transistor gain of an n-channel transistor as compared to a p-channel transistor.

The second modification must occur in the tristate circuit for the lower half of the buffer circuit. Since a high to low transition starts at VDD-$V_{tn}$, the sense transistor (P106 in FIG. 1 and P206 in FIG. 2) must connect to VDD-$V_{tn}$ instead of to VDD. Therefore, the p-channel transistor that connects the sense transistor to VDD (P120 in FIG. 1, and P220 in FIG. 2) must be replaced by an n-channel transistor. This ensures that the signal level drops to one $V_{tp}$ below VDD-$V_{tn}$ before the buffer circuit detects a high to low transition.

Figure 3:
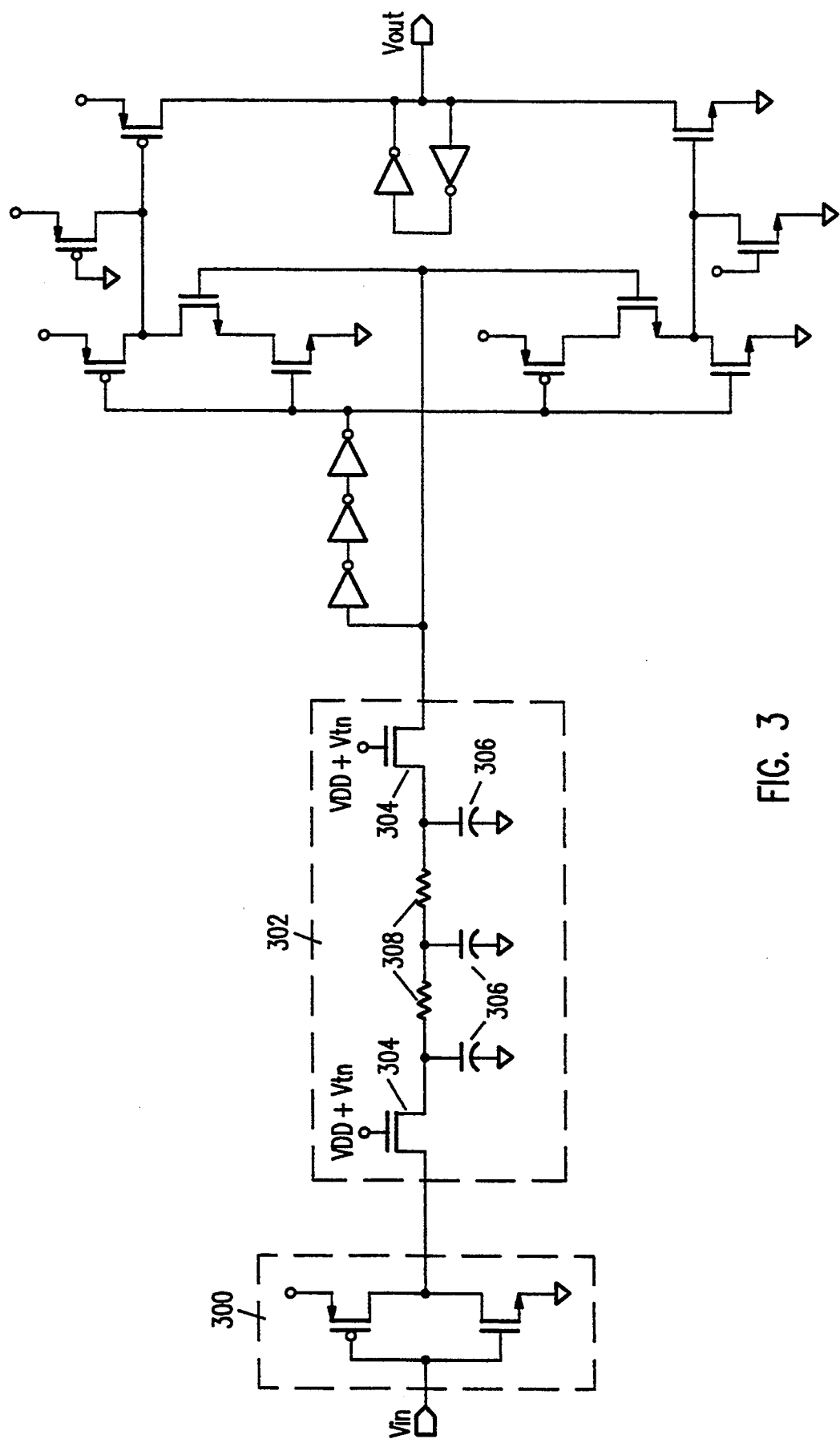
FIG. 3 is a circuit schematic of the second embodiment showing the end-of-line buffer circuit of FIG. 2 connected to a load circuit that simulate the loading of the signal.

To illustrate the amount of reduction in signal propagation delay, the end-of-line buffer circuit of FIG. 2 is shown in FIG. 3 connected to a load circuit. The input signal is driven onto the line by a typical line driver 300 and then applied to the line. The signal goes through a load circuit 302 before reaching the input of the buffer circuit. Load circuit 302 simulates typical loading on a long connector line and includes transmission gates 304, capacitors 306 and resistors 308. For a line having signals with full-rail swing, the control voltage on the gate terminals of the transmission gates 304 must be at VDD+$V_{tn}$.

Figure 4:
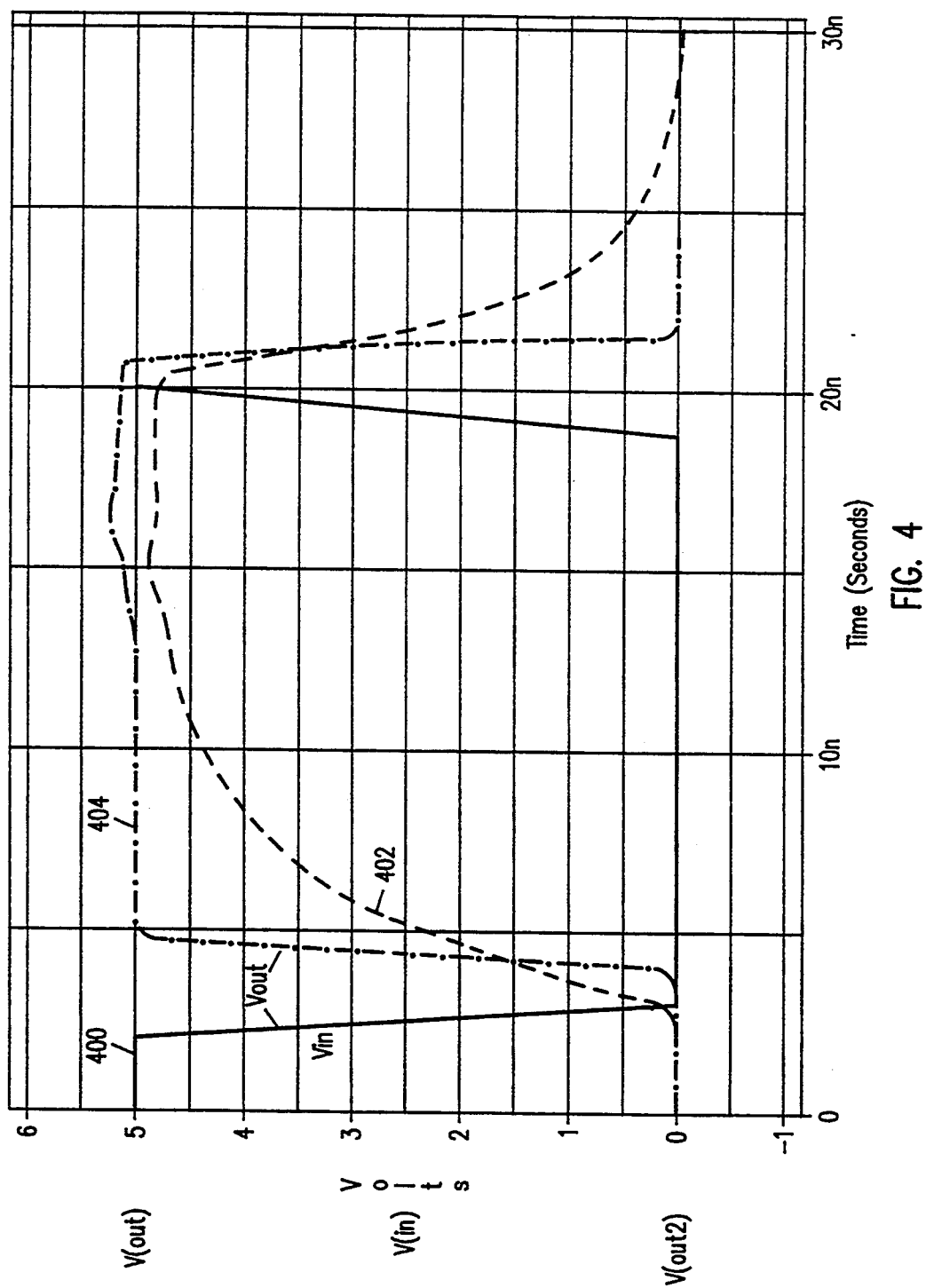
FIG. 4 is a timing diagram showing the rise and fall time of an output signal applied to circuit of FIG. 3.

FIG. 4 is a timing diagram comparing the rise and fall times of the signal at the input and output of the buffer circuit. Line 400 shows the input signal at the source ($V_{in}$). Line 402 shows the same signal after having gone through the load circuit 302 and at the input of the buffer circuit. Finally, line 404 shows the signal at the output of the buffer circuit ($V_{out}$). The signal transitions (rising and falling edges) at the input and output of the buffer circuit show a significant decrease in rise and fall time of the signal at the output of the buffer.

In conclusion, the present invention provides various embodiments of a buffer circuit that reduce signal propagation delays for heavily loaded lines by early detection and driving of signal transitions. While the above is a complete description of the specific embodiments it is possible to use various alternatives, modifications and equivalents. Therefore, the scope of this invention should be determined not with reference to the above description, but should, instead, be determined by the appended claims, along with their full scope of equivalents.

What is claimed is:

1. A signal buffering circuit for driving a signal line, comprising:
   a driver stage including a pull-up transistor and a pull-down transistor having a common output terminal coupled to the signal line;
   a rising-edge detection circuit coupled to said pull-up transistor and the signal line, for detecting a rising transition of a signal on the signal line before said signal reaches a logical threshold level;
   a falling-edge detection circuit coupled to said pull-down transistor and the signal line, for detecting a falling transition on said signal before said signal reaches a logical threshold level; and
   tristating means coupled to said driver stage for automatically deactivating said pull-up transistor and said pull-down transistor, a predetermined delay after full transition of said signal is complete.

2. The signal buffering circuit of claim 1, wherein said rising-edge detection circuit comprises a sense transistor having a first terminal coupled to the signal line and a second terminal coupled to said pull-up transistor, said sense transistor for activating said pull-up transistor upon sensing a start of a rising-edge transition of said signal before said signal reaches a logical threshold level.

3. The signal buffering circuit of claim 1, wherein said falling-edge detection circuit comprises a sense transistor having a first terminal coupled to the signal line and a second terminal coupled to said pull-down transistor, said sense transistor for activating said pull-down transistor upon sensing a start of a falling-edge transition of said signal before said signal reaches a logical threshold level.

4. The signal buffering circuit of claim 1, wherein said tristating means comprises:
   a rising-edge tristate circuit coupled to said rising-edge detector circuit;
   a falling-edge tristate circuit coupled to said falling-edge detector circuit; and
   a delay circuit having an input coupled to the line, and an output coupled to said rising-edge tristate circuit and said falling-edge tristate circuit.

5. The signal buffering circuit of claim 4, wherein said delay circuit comprises an odd number of serially coupled inverters, providing a delay between completion of a transition on the line and tristating of said driver stage.

6. A signal buffering circuit for driving a signal line, comprising:
   a signal pull-up transistor coupled to the line for pulling a signal on the line up to a first reference voltage;
   a signal pull-down transistor coupled to the line for pulling a signal on the line down to a second reference voltage;
   a rising-edge sense transistor with a first terminal coupled to the line, and a second terminal coupled to said pull-up transistor;
   a falling-edge sense transistor with a first terminal coupled to the line, and a second terminal coupled to said pull-down transistor;
   a rising-edge tristate circuit coupled to said rising-edge sense transistor and said signal pull-up transistor;
   a falling-edge tristate circuit coupled to said falling-edge sense transistor and said signal pull-down transistor; and
   an inverter delay chain, including an odd number of serially coupled inverter, coupled between the line and said rising-edge and falling-edge tristate circuits.

7. The signal buffering circuit of claim 6, wherein said rising-edge tristate circuit comprises:
   a pull-up transistor coupled to said signal pull-up transistor and said rising-edge sense transistor second terminal; and
   a pull-down transistor coupled to a third terminal of said rising-edge sense transistor,
   wherein, an output of said inverter delay chain drives an input terminal of said pull-up and pull-down transistors.

8. The signal buffering circuit of claim 6, wherein said falling-edge tristate circuit comprises:
   a pull-up transistor coupled to said signal pull-down transistor and said falling-edge sense transistor second terminal; and
   a pull-down transistor coupled to a third terminal of said falling-edge sense transistor,
   wherein, an output of said inverter delay chain drives an input terminal of said pull-up and pull-down transistors.

9. The signal buffering circuit of claim 8, wherein said pull-up transistor is a p-channel MOS transistor.

10. The signal buffering circuit of claim 8, wherein said pull-up transistor is an n-channel MOS transistor.

11. A signal buffering circuit for driving a signal line, comprising:
   a driver stage including a pull-up transistor and a pull-down transistor with a common output terminal coupled to the signal line;
   means, including a rising-edge detection circuit and a falling-edge detection circuit coupled to said pull-up transistor and pull-down transistor, respectively, said means for detecting a transition of a signal on the signal line before said signal reaches a logical threshold level; and
   a tristating circuit, coupled to said driver stage, said tristating circuit including:
   a rising-edge tristate circuit coupled to said rising-edge detector circuit;
   a falling-edge tristate circuit coupled to said falling-edge detector circuit; and
   a delay circuit having an input coupled to the line, and an output coupled to said rising-edge tristate circuit and said falling-edge tristate circuit.

12. A signal buffering circuit for driving a signal line, comprising:
   a positive transition detection circuit including:
   a first sense transistor having a control terminal connected to an input signal, and a first pull-up transistor and a first pull-down transistor coupled to a first and second current-carrying terminals of said first sense transistor, respectively;

a negative transition detection circuit including:

a second sense transistor having a control terminal connected to said input signal, and a second pull-up transistor and a second pull-down transistor coupled to a first and second current-carrying terminals of said second sense transistor;

a delay circuit having an input connected to said input signal and an output coupled to control terminals of said first and second pull-up and pull-down transistors;

a pull-up driver transistor with a control terminal coupled to said positive transition detection circuit, and an output terminal coupled to the signal line; and a pull-down driver transistor with a control terminal coupled to said negative transition detection circuit, and an output terminal coupled to the signal line.

13. The signal buffering circuit of claim 12 further comprising:

a resistive pull-up device coupled to said control terminal of said pull-up driver transistor; and a resistive pull-down device coupled to said control terminal of said pull-down driver transistor.

14. A method of driving a signal on a line, comprising the steps of:

(a) detecting a direction of transition of the signal on the line before the signal reaches a logical threshold level;

(b) temporarily activating a pull-up transistor coupled to the line for driving the signal to a logic high level when said direction of transition is positive and before the signal transition reaches a logical threshold level; and (c) temporarily activating a pull-down transistor coupled to the line for driving the signal to a logic low level when said direction of transition is negative and before the signal transition reaches a logical threshold level.

* * * * *